ELECTRONIC EQUIPMENT MOUNTING AND HOUSING ARRANGEMENTS

Filed May 27, 1963 2 Sheets-Sheet 1

INVENTORS.
RICHARD M. SISK
ROBERT VESCIGLIO
BY JONAS M. SHAPIRO
THEODORE WATKIN
Alfred E. Miller and Daniel Jay Tick
ATTORNEYS

ELECTRONIC EQUIPMENT MOUNTING AND HOUSING ARRANGEMENTS

Filed May 27, 1963 2 Sheets-Sheet 2

INVENTORS
RICHARD M. SISK
JONAS M. SHAPIRO
ROBERT VESCIGLIO
THEODORE WATKIN
BY
Daniel Jay Tick & Alfred E. Miller
ATTORNEYS United States Patent Office 3,228,532
Patented Jan. 11, 1966

3,228,532

ELECTRONIC EQUIPMENT MOUNTING AND HOUSING ARRANGEMENTS

Richard M. Sisk, South Norwalk, Jonas M. Shapiro, Stamford, Robert Vesciglio, Westport, and Theodore Watkin, Stamford, Conn., assignors to Manson Laboratories, Inc., Stamford, Conn., a corporation of Connecticut Filed May 27, 1963, Ser. No. 283,226
10 Claims. (Cl. 211—26)

The present invention relates to electronic equipment mounting and housing arrangements. More particularly, the invention relates to a rack for supporting mounting arrangements for electronic equipment.

The rack or cabinet of the present invention is sturdy and sound in structure and permits the mountings of units from the front of the rack or from the sides of the rack. The units are supported by the rack with maximum stability. The rack is of simple structure and utilizes a minimum number of component parts.

All wiring is brought to the front of the rack. Since this includes input and output power, signal lines, fuses, switching, controls and indicators, the entire rack may be checked from the front. Two U-shaped side members with protective covers on each side of the rack, contain all the wiring and are easily removed for ready accessibility. Since no cover or door is required at the rear of the rack, the rack may be installed flush against a wall or bulkhead. Stabilizers may be added to the rear of the rack for additional support.

Vibration and shock mounts efficiently utilizes the space in each system. Bench mounts are utilized when units are installed on a bench, either singly or in stack array. In-line mounts are utilized to isolate individual units in a single rack. Rack mounts protect rack systems and add less than one inch to the overall rack dimensions.

The principal object of the present invention is to provide new and improved electronic equipment mounting and housing arrangements.

An object of the present invention is to provide a new and improved rack for mounting electronic equipment.

An object of the present invention is to provide a rack of simple structure but great strength.

An object of the present invention is to provide a rack which permits rapid and facile maintenance of equipment mounted therein.

An object of the present invention is to provide a rack which permits rapid and facile wiring and testing of equipment mounted therein.

An object of the present invention is to provide a rack which permits rapid and facile maintenance of input and output cables.

An object of the present invention is to provide a rack of great compactness and sturdiness.

An object of the present invention is to provide a rack which permits front panel testing of equipment mounted therein.

An object of the present invention is to provide a rack which may be rapidly and facilely assembled and disassembled.

An object of the present invention is to provide a rack which utilizes a minimum of space for shock and vibration mounts.

An object of the present invention is to provide a rack which utilizes a minimum of space for stabilizer equipment.

An object of the present invention is to provide a rack which is constructed of very few parts.

In accordance with the present invention, the rack comprises two substantially channel or U-shaped side members supported in a manner whereby they open toward each other. A front panel of substantially U-shaped cross-section is pivotally affixed to each of the side members on its front portion adjacent the front edge of its base portion and extending in the direction of length of the base portion, each of the front panels opening toward the front portion of the side member.

In order that the present invention may be readily carried into effect, it will now be described with reference to the accompanying drawings, wherein.

In the figures, the same components are indicated by the same reference numerals.

Figure 2:
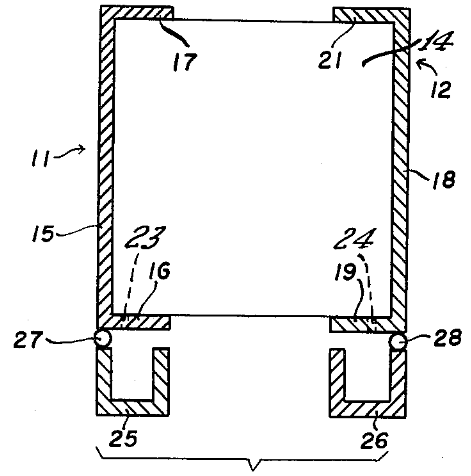
FIG. 2 is a top sectional view of an embodiment of the rack of the present invention, taken along the lines I—I of FIG. 3.
Figure 4:
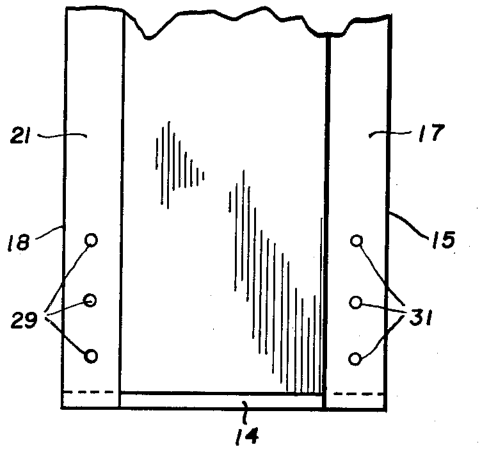
FIG. 4 is a rear view of a portion of the embodiment of FIG. 2.
Figures 3, 5:
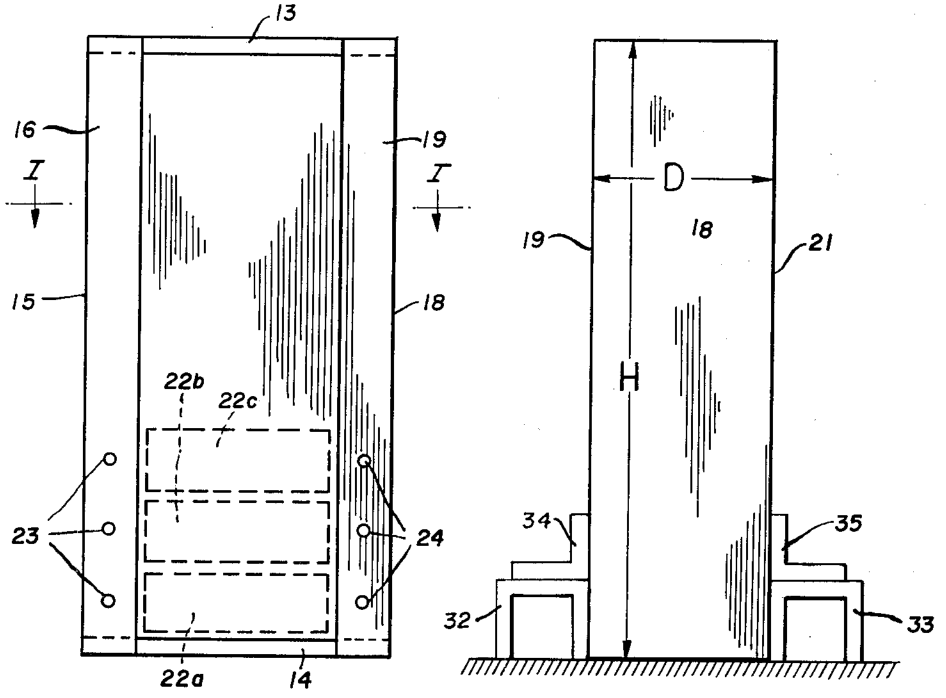
FIG. 3 is a front view of a portion of the embodiment of FIG. 2.
FIG. 5 is a side view, partly in section, of a portion of a modification of the embodiment of FIG. 2.

FIG. 2 is a top sectional view of an embodiment of the rack of the present invention, taken along the lines I—I of FIG. 3. In FIG. 2, the simple, but sturdy and compact structure of the rack is clearly illustrated. The rack comprises two elongated side members 11 and 12 of substantially U-shaped cross-section which are identical to each other in configuration and dimension. The side members 11 and 12 are supported by any suitable means in a manner whereby they open toward each other. The side members 11 and 12 may thus be suitably supported by a top member 13 and a bottom member 14 (FIGS. 3 and 4). The side members 11 and 12 may be affixed to the top and bottom members 13 and 14 by any suitable means known in the art. The bottom member 14 may be replaced by two channel members, one being affixed to the bottoms of the side members 11 and 12 at the front of the rack, and the other being affixed to the bottoms of said side members at the rear of the rack. Furthermore, the bottom member 14 may be dispensed with and the side members 11 and 12 may be supported at the bottom by externally affixed front and rear channels 32 and 33 (FIG. 5).

The side member 11 has a substantially planar base portion 15 of rectangular configuration having a front edge and a rear edge and a length extending from a bottom end to a top end which is substantially the height dimension H of the rack arrangement and a width which is substantially the depth dimension D of the rack arrangement, a first portion 16 extending substantially perpendicularly from said base member along its front edge in the direction of its length and a rear portion 17 extending substantially perpendicularly from said base member along its rear edge in the direction of its length. The front and rear portions 16 and 17 form a U-shaped channel with the base portion 15.

The side member 12 has a substantially planar base portion 18 of rectangular configuration having a front edge and a rear edge and a length extending from a bottom end to a top end which is substantially the height dimension H of the rack arrangement and a width which is substantially the depth dimension D of the rack arrangement, a front portion 19 extending substantially perpendicularly from said base member along its front edge in the direction of its length and a rear portion 21 extending substantially perpendicularly from said base member along its rear edge in the direction of its length. The front and rear portions 19 and 21 form a U-shaped channel with the base portion 18.

The two-channel construction of the rack of the present invention is high simplified over racks of known type which utilize a plurality of interconnected support members and provides a rack of great strength, compactness and sturdiness, which may be rapidly and facilely assembled and disassembled and which is constructed of very few parts.

The assembly and disassembly of the rack is accomplished by means of a few bolts which are utilized to affix the side members 11 and 12 to the top and bottom members 13 and 14, respectively. If two channel members are utilized in place of the bottom member 14, the side members will be affixed to such two channel members, of course. Racks of known type require considerably more time and effort for assembly and disasembly.

Figure 6:
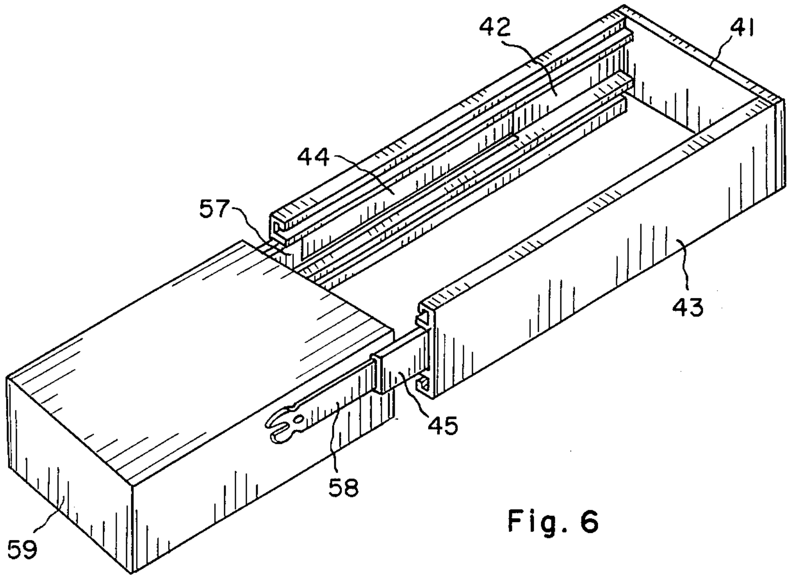
FIG. 6 is a perspective view of an embodiment of a mounting arrangement which may be utilized in the rack of the present invention.
Figure 1:
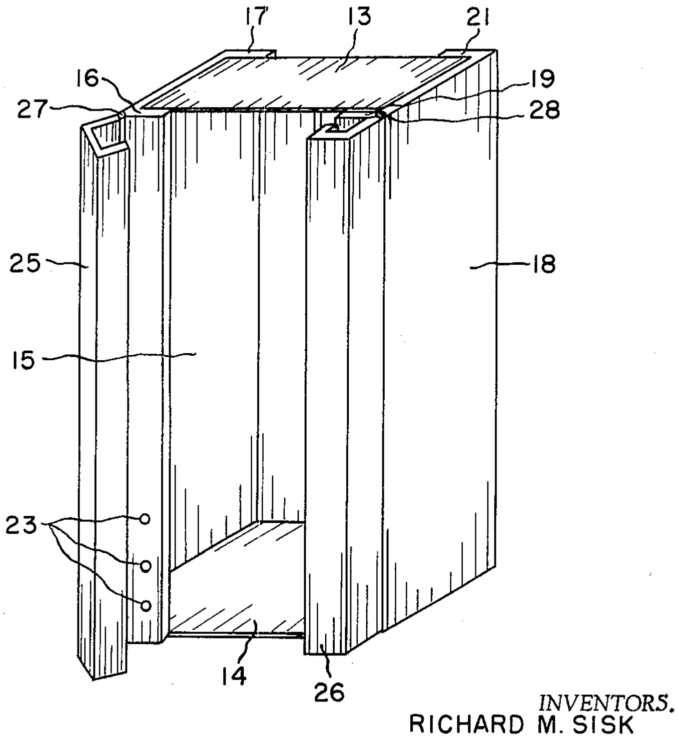
FIG. 1 is a perspective view of an embodiment of the rack of the present invention.

Electronic equipment mounted in the rack is mounted on a plurality of mounting arrangements such as, for example, mounting arrangements of the type shown in FIG. 6, positioned in a manner indicated by broken lines 22*a*, 22*b* and 22*c* of FIG. 3. The mounting arrangements are slidably mounted in the rack between the top and bottom members 13 and 14 and parallel thereto. The mounting arrangements may be slidably mounted in the rack by any suitable means known in the art. The space bounded by the front, rear and base portions of each side member 11 and 12 is utilized for cables, wires, leads and the like.

The input cables, including power cables, are fed to the electronic equipment mounted in the rack through apertures such as, for example, apertures formed through the rear portions 17 and 21 of the side members 11 and 12, respectively. The output cables, including output lines and test lines, are led to the front of the rack through apertures such as, for example, apertures 23 and 24 shown in FIG. 3, formed through the front portions 16 and 19 of the side members 11 and 12, respectiveiy. This arrangement permits rapid and facile maintenance of equipment mounted in the rack, rapid and facile wiring and testing of equipment mounted in the rack, rapid and facile maintenance of input and output cables and front panel testing of equipment mounted in the rack.

The utilization of the space bounded by the front and rear portions and the base portion of each side member 11 and 12 for cables, wires, leads, and the like, thus provides a substantial improvement over racks of known type which support their cables and the like for the most part in the back of the rack and support some of their channels on the sides of the rack. The support of the cables and the like in the rack of the present invention enables front panels to be utilized for testing the equipment mounted in said rack and for deriving the outputs from such equipment.

Front panels such as, for example, front panels 25 and 26, respectively, may be removably, pivotally, or permanently affixed to the front portions 16 and 19, respectively, of the side members 11 and 12, respectively, by any suitable means such as, for example, pivot means 27 and 28, respectively. The pivot means 27 and 28 may comprise any suitable hinge means, for example. The front panels 25 and 26 are identical to each other and extend for substantially the entire length of the corresponding front portions 16 and 19 from their respective base portions 15 and 18. Each front panel 25 and 26 functions to carry the output and test connections to a readily accessible location at the front of the rack.

Each front panel 25 and 26 is of substantially U-shaped cross-section and is pivotally affixed to its corresponding side member 11 and 12, respectively, on its front portion adjacent the front edge of its base portion and extending in the direction of the length H of said base portion; each of the front panels opening toward the front portion of the corresponding side member.

The cables, lines and leads are led into the side members 11 and 12 through apertures such as, for example, apertures 29 and 31, shown in FIG. 4, formed through the rear portions 17 and 21 of the side members 11 and 12, respectively.

In accordance with another feature of the rack of the present invention, a minimum of space is utilized for the shock and vibration mounts and for the stabilizer equipment which is utilized with the rack. In racks of known type, the shock ad vibration mounts are mounted on an under-platform which raises the height dimension of the rack considerably and the stabilizer equipment is mounted on the back of the rack so that it increases the depth dimension of the rack. In a modification of the rack of the present invention, as illustrated in FIG. 5, the shock and vibration mounts are mounted in a front channel 32 and the stabilizer equipment is mounted in a rear channel 33, so that a minimum addition is made to the height and depth dimensions of the rack. The channels 32 and 33 preferably extend any necessary distances parallel to the front and rear portions of the side members 11 and 12.

The front channel 32 is of substantially U-shaped cross-section and is affixed to the front portions 16 and 19 of the side members 11 and 12 and extends substantially perpendicularly to the base portions 15 and 18 of the side members and substantially parallel to the front portions in the area of the bottom of the rack. The rear channel 33 is of substantially U-shaped cross-section and is affixed to the rear portions 17 and 21 of the side members 11 and 12 and extends substantially perpendicularly to the base portions 15 and 18 of the side members and substantially parallel to the rear portions in the area of the bottom of the rack. L-shaped brackets 34 and 35, respectively, of any suitable dimensions may be utilized to secure the positions of the front and rear channels 32 and 33, respectively. The brackets 34 and 35 may be of any desired length in the direction perpendicular to the plane of the sheet of the drawing of FIG. 5. Any suitable reinforcing or securing means may be utilized to secure the positions of the front and rear channels 32 and 33.

FIG. 6 is a perspective view of an embodiment of a mounting arrangement which may be utilized in the rack of the present invention.

The back 41 of the casing may be affixed to the sides 42 and 43 thereof, respectively. A primary support arm 44 is slidably mounted on the side 42 and a primary support arm 45 is slidably mounted on the side 43. A secondary support arm 57 is slidably mounted on the primary support arm 44 and a secondary support arm 58 is slidably mounted on the primary support arm 45. The primary and secondary support arms 44 and 45 and 57 and 58 are adapted to support an electronic equipment unit 59 between them in the usual manner.

In FIG. 6, each of the sides 42 and 43 of the casing may have integrally formed guide projections extending therefrom. The primary support arms 44 and 45 are slidably mounted on the primary guide projectionns of the sides 42 and 43. Each of the primary support arms 44 and 45 may have integrally formed guide projections extending therefrom. The secondary support arms 57 and 58 are slidably mounted on the guide projections of the primary support arms 44 and 45, respectively. The primary support arms and the secondary support arms are preferably of aluminum.

Each side 42 and 43 is identical with the other, each primary support arm 44 and 45 is identical with the other and each secondary support arm 57 and 58 is identical with the other. The sides 42 and 43 and the primary support arms 44 and 45 are supported in a manner whereby they open toward each other.

The sides 42 and 43 of the casing are spaced and opposite from each other and are substantially parallel to each other and are affixed to the inside of the rack, when utilized therein. The back 41 is substantially perpendicular to the sides 42 and 43 and is joined at one end to one side and is joined at the other end to the other side The fronts of the electronic equipment units 59, when the sides are affixed to the rack, are indicated by broken lines 22a, 22b and 22c of FIG. 3.

While the invention has been described by means of specific examples and in specific embodiments, we do not wish to be limited thereto, for obvious modifications will occur to those skilled in the art without departing from the spirit and scope of the invention.

What we claim is:

1. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other; and a front panel pivotally affixed to each of said side members on its front portion adjacent the front edge of its base portion and extending in the direction of the length of said base portion.

2. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially prependicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other; and a front panel of substantially U-shaped cross-section pivotally affixed to each of said side members on its front portion adjacent the front edge of its base portion and extending in the direction of the length of said base portion, each of said front panels opening toward the front portion of said side member.

3. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other; and a front channel affixed to the front portions of said side members and extending substantially perpendicularly to the base portions of said side members and substantially parallel to said front portions in the area of said bottom member.

4. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other; and a rear channel affixed to the rear portions of said side members and extending substantially perpendicularly to the base portions of said side members and substantially parallel to said rear portions in the area of said bottom member.

5. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other; and a front channel of substarntially U-shape cross-section affixed to the front portions of said side members and extending substantially perpendicularly to the base portions of said side members and substantially parallel to said front portions in the area of said bottom member.

6. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other;

a front panel of substantially U-shaped cross-section pivotally affixed to each of said side members on its front portion adjacent the front edge of its base portion and extending in the direction of the length of said base portion, each of said front panels opening toward the front portion of said side member; and a rear channel of substantially U-shaped cross-section affixed to the rear portions of said side members and extending substantially perpendicularly to the base portions of said side members and substantially parallel to said rear portions in the area of said bottom member.

7. A rack arrangement for housing a plurality of electronic equipment units comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other;

a front panel of substantially U-shaped cross-section pivotally affixed to each of said side members on its front portion adjacent the front edge of its base portion and extending in the direction of the length of said base portion, each of said front panels opening toward the front portion of said side member;

a front channel of substantially U-shaped cross-section affixed to the front portions of said side members and extending substantially perpendicularly to the base portions of said side members and substantially parallel to said front portions in the area of said bottom member; and a rear channel of substantially L-shaped cross-section affixed to the rear portions of said side members and extending substantially perpendicularly to the base portions of said side members and substantially parallel to said rear portions in the area of said bottom member.

8. A rack arrangement for housing a plurality of electronic equipment units having cables, wires and leads connected thereto, said rack comprising, in combination, a pair of elongated side members each having a substantially U-shaped cross-section and extending from a bottom end to a top end;

a top member removably affixed to the top ends of said pair of side members;

a bottom member removably affixed to the bottom ends of said pair of side members in a manner whereby said side members are positioned in substantially parallel spaced relation to each other and open toward each other;

a front panel of substantially U-shaped cross-section pivotally affixed to each of said side members on its front portion adjacent the front edge of its base portion and extending in the direction of the length of said base portion, each of said front panels opening toward the front portion of said side member; and means for leading said cables, wires and leads into and out of the areas formed by the U-shaped cross-sections of said side members.

9. A rack arrangement for housing a plurality of electronic equipment units having cables, wires and leads connected thereto, said rack comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other;

a front panel of substantially U-shaped cross-section pivotally affixed to each of said side members on its front portion adjacent the front edge of its base portion and extending in the direction of the length of said base portion, each of said front panels opening toward the front portion of said side member; and means formed through the front and rear portions of said side members for leading said cables, wires and leads into and out of the areas formed by the U-shaped cross-sections of said side members.

10. A rack arrangement for housing a plurality of electronic equipment units having cables, wires and leads connected thereto, said rack comprising, in combination, a pair of elongated side members each comprising a substantially planar base portion of rectangular configuration having a front edge and a rear edge and a length extending from a bottom end to a top end which is substantially the height dimension of the rack arrangement and a width which is substantially the depth dimension of the rack arrangement, a front portion extending substantially perpendicularly from said base member along its front edge in the direction of its length and a rear portion extending substantially perpendicularly from said base member along its rear edge in the direction of its length;

a top member removably affixed to the top ends of said pair of side members;

a bottom member removably affixed to the bottom ends of said pair of side members in a manner whereby said side members are positioned in substantially parallel spaced relation to each other and open toward each other;

a front panel of substantially U-shaped cross-section pivotally affixed to each of said side members on its front portion adjacent the front edge of its base portion and extending in the direction of the length of said base portion, each of said front panels opening toward the front portion of said side member;

a front channel of substantially U-shaped cross-section affixed to the front portions of said side members and extending substantially perpendicularly to the base portions of said side members and substantially parallel to said front portions in the area of said bottom member;

a rear channel of substantially U-shaped cross-section affixed to the rear portions of said side members and extending substantially perpendicularly to the base portions of said side members and substantially parallel to said rear portions in the area of said bottom member; and means formed through the front and rear portions of said side members for leading said cables, wires and leads into and out of the areas formed by the U-shaped cross-sections of said side members.

References Cited by the Examiner

UNITED STATES PATENTS

| | | | |
|---|---|---|---|
| 1,556,684 | 10/1925 | Gardner | 312—273 |
| 1,558,855 | 10/1925 | Field | 211—26 |
| 2,054,843 | 9/1936 | Weber | 312—273 |
| 2,505,299 | 4/1950 | Muller | 211—148 |
| 2,880,264 | 3/1959 | Ruskin | 174—67 |
| 2,906,380 | 9/1959 | Sanders | 189—34 |
| 2,964,373 | 12/1960 | Paskin | 312—339 |
| 3,009,755 | 11/1961 | Rackow | 312—339 |
| 3,055,506 | 9/1962 | Moorhead | 211—26 |
| 3,127,961 | 4/1964 | Frazier | 189—34 |

CHANCELLOR E. HARRIS, *Primary Examiner.*

CLAUDE A. LE ROY, *Examiner.*